US006331942B1

United States Patent
Peterson

(10) Patent No.: US 6,331,942 B1
(45) Date of Patent: Dec. 18, 2001

(54) CONTENT ADDRESSABLE MEMORY CELL AND DESIGN METHODOLOGY UTILIZING GROUNDING CIRCUITRY

(75) Inventor: LuVerne R. Peterson, San Diego, CA (US)

(73) Assignee: Tality, L.P., San Jose, CA (US)

( * ) Notice: Subject to any disclaimer, the term of this patent is extended or adjusted under 35 U.S.C. 154(b) by 0 days.

(21) Appl. No.: 09/658,543

(22) Filed: Sep. 9, 2000

(51) Int. Cl.[7] .................................................. G11C 15/00
(52) U.S. Cl. ........................................ 365/49; 365/230.03
(58) Field of Search .................................. 365/49, 185.2, 365/230.03

(56) References Cited

U.S. PATENT DOCUMENTS

| | | | |
|---|---|---|---|
| 3,717,848 | 2/1973 | Irvin et al. | 340/146.3 Q |
| 3,969,707 | * 7/1976 | Lane et al. | 365/49 |
| 4,831,585 | 5/1989 | Wade et al. | 365/49 |
| 4,833,643 | * 5/1989 | Hori | 365/49 |
| 5,014,327 | 5/1991 | Potter et al. | 382/14 |
| 5,051,949 | 9/1991 | Young | 365/49 |
| 5,319,590 | 6/1994 | Montoye | 365/49 |
| 5,422,838 | 6/1995 | Lin | 365/49 |
| 5,453,948 | 9/1995 | Yoneda | 365/49 |
| 5,455,784 | 10/1995 | Yamada | 365/49 |
| 5,666,306 | 9/1997 | Forbes | 365/149 |
| 5,859,791 | 1/1999 | Schultz et al. | 365/49 |
| 5,890,201 | 3/1999 | McLellan et al. | 711/108 |
| 5,905,668 | 5/1999 | Takahashi | 365/49 |
| 5,949,696 | 9/1999 | Threewitt | 365/49 |
| 5,999,435 | 12/1999 | Henderson | 365/49 |
| 6,044,005 | 3/2000 | Gibson et al. | 365/49 |
| 6,163,473 | 12/2000 | Hannum | 365/49 |
| 6,191,970 | 2/2001 | Pereira | 365/49 |

OTHER PUBLICATIONS

Shafai, et al., "Fully Parallel 30–MHz, 2.5–Mb CAM," *IEEE Journal of Solid–State Circuits*, vol. 33(11):1690–1696 (Nov. 1998).

* cited by examiner

*Primary Examiner*—Terrell W. Fears
(74) *Attorney, Agent, or Firm*—Lyon & Lyon LLP

(57) ABSTRACT

A CAM cell design methodology and a method of precharge and comparison timing is disclosed. A CAM cell utilizing this design methodology includes grounding circuitry and a P-channel transistor configured to communicate a comparison result to a match line using the Miller effect. In one embodiment, the CAM cell further includes a positive comparison bit line, a negative comparison bit line, a first dual-ended CAM memory core cell configured to store data, a second dual-ended CAM memory core cell configured to store masking data, comparison circuitry, and a second P-channel transistor configured to communicate a masked state to the match line.

46 Claims, 7 Drawing Sheets

CONTENT ADDRESSABLE MEMORY CELL AND DESIGN METHODOLOGY UTILIZING GROUNDING CIRCUITRY

BACKGROUND OF THE INVENTION

Authorization Pursuant to 37 C.F.R. 1.71(e)

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

1. Field of the Invention

The field of the present invention relates generally to content addressable memories (CAMs), and more particularly to CAM cells for constructing high-speed, large-capacity CAM arrays with full bit-wise and word-wise masking capability.

2. Related Art

A content addressable memory (CAM) is an associative memory device in which memory elements are identified (i.e. addressed) by their content, rather than by their physical location. A CAM generally includes a matrix of CAM cells arranged in rows and columns. Each CAM cell in this matrix usually includes a static memory element and comparison circuitry.

Typical uses for CAMs include pattern-matching memories for optical character recognition, and translation look-aside buffers for digital computers that employ virtual memory. In a traditional CAM, each CAM cell stores one bit of digital information in the static memory element. In some CAMs, each CAM cell employs "dual ended" logic, such that the cell makes available both a stored bit and its inverse. The static memory elements are connected with differential bit lines and a word line, thereby allowing read and write data operations. Typically, the comparison circuitry in each CAM cell is connected with separate differential compare bit lines, thus creating more flexibility in the timing of read, write and search operations.

An array of CAM cells, commonly arranged in a row, comprise a word of data. During a search operation, the CAM compares a search word (comparand) with a set of words stored within the CAM. One or more indicators associated with each word of data, commonly called match lines, produce a comparison result, which identifies the word(s) in the CAM that match the comparand. Thus a CAM usually requires more transistors and/or other circuit elements than standard Random Access Memory (RAM), but adds a "parallel processing" characteristic not found in a standard RAM.

One common use of a CAM is as a search tool for network address filtering. Network address filtering is a process for searching a router's station list for source and destination addresses and routing packets to the correct port(s). Modern telecommunication networks typically use digital packet or block type data formats as a means for dynamically routing data through a network. The advantages of such dynamically routed packetized data are well known. However, as data transfer rates continue to increase, the finite processing power available at network routers can cause communication bottlenecks, where data packets arrive faster than the router can determine where to route the incoming packets. Such bottlenecks can easily degrade the overall performance of a network.

A CAM can reduce processing bottlenecks by increasing the speed at which routing can be accomplished. Typical packet-based communication networks utilize digital "header" information at the beginning of each packet in the routing process. This header information comprises address fields defining source and destination information. Long addresses are necessary to accommodate the large number of potential addresses common in modern communication networks. These long addresses can substantially increase the time required to make routing decisions, thus requiring a fast searching technique during network address filtering. A CAM generally achieves this search performance by simultaneously comparing all entries stored in the CAM with a "comparand."

FIG. 1 is schematic block diagram illustrating a simple example of a conventional content addressable memory (CAM) utilizing dual-ended logic, with enlargements illustrating further details of a CAM cell and a CAM memory core cell. In FIG. 1, a CAM 100 is shown with only four rows and four columns, for a total of 16 CAM cells 110, whereas in most practical applications the CAM would have many more CAM cells. Each row corresponds to a word, or part of a word, of data. Each column corresponds to a bit of data from each row or word. Each CAM cell 110 in a column is coupled with a local pair of bit lines 112 (b and bn) and a local pair of compare lines 114 (k and kn). Because the CAM 100 in this example uses dual ended logic, the local pair of bit lines 112 carry differential data representing a single bit of data, and the local pair of compare lines 114 carry differential data representing a single bit of comparison data.

Each CAM cell 110 in a row is connected to a word line 116 and a match line 118. The word line 116 enables read and write access to the CAM cells 110. The match line 118 provides an output for a comparison result. The multiple match lines 118 feed into an encoder 120. Typically, the encoder 120 generates three output signals. A line designated HT is asserted high when one of the words stored in the CAM matches the comparand. A line designated AD, outputs a set of signals representing the address of the matched word. A line designated MLT is asserted high when multiple stored words match the comparand.

In some conventional designs, a priority encoder is used in place of the encoder 120. The priority encoder functions in the same way except that in addition to asserting the MLT line high when multiple stored words match the comparand, it also outputs a set of signals on the AD line representing the address of the matched word in the lowest position in the CAM. Moreover, in some conventional designs a dynamic random access memory (DRAM) or a static random access memory (SRAM) are employed in place of the encoder 120, thereby resulting in a CAM-DRAM or CAM-SRAM configuration, as is well known in the art.

CAM cell 110a in FIG. 1 is an expanded view of a single CAM cell 110, as may be found in a typical CAM. CAM cell 110a includes a CAM memory core cell 130, a "comparator block" comprising two N-channel field effect transistors (FET) 132 and 134, and a match line N-channel FET 136. The CAM memory core cell 130 has two outputs designated C and CN, which are differential outputs representing a single bit of data stored in CAM memory core cell 130. The first N-channel FET 132 connects to the positive compare line K and is gated by the output C. The second N-channel FET 134 connects to the negative compare line KN and is gated by the output CN. The output of the comparator block gates the match line N-channel FET 136, thereby transmitting a comparison result for CAM cell 110a to the match line 118 during a compare operation.

Alternative conventional designs involve transmission of a comparison result to a match line in a wired-NOR configuration. In these designs, the first N-channel FET 132 would be gated by CN, and the second N-channel FET 134 would be gated by C. The match line N-channel FET 136 remains gated by the output of the comparator block, but instead of connecting a match line input with a match line output, it connects the match line 118 with a ground. In this fashion, the match line 118 is pulled low whenever a mismatch between the stored word and the comparand occurs. This configuration results in a fast comparison, but every time there is a mismatch, the match lines must be discharged and then charged up again. For large CAMs, this configuration results in excessive power consumption.

FIG. 1 further shows an expanded view of an example of a CAM memory core cell 130a. In a typical configuration, the CAM memory core cell 130a includes a static memory element 140 and two access N-channel FETs 142 and 144. The static memory element 140 typically consists of two cross-coupled inverters.

While the CAM design represented by the CAM 100 can be used to construct relatively high-speed, large-capacity CAMs, in certain applications it may experience limitations. For example, when the CAM 100 becomes very large, the chances that multiple hits will occur during a compare operation increases. When this happens, the word data stored in the CAM 100 needs to be checked and updated, which can be a time consuming process. Without word-wise masking capability, the data in the CAM word that matched would need to be physically overwritten. Even with word-wise masking capability, it could take multiple cycles to find the right data if more than two hits occur during a compare operation.

In some CAM applications, only particular fields of the word data stored in the CAM need to be checked. For example, if the CAM is getting read requests from multiple devices, but the CAM only needs to check a certain small subset of those read requests, it requires the ability to mask out some read requests and find the particular data it cares about. In these CAM applications, the chances of multiple hits in the CAM increase significantly.

One technique for attempting to provide masking is to add a "valid bit" to each CAM cell. By adding a valid bit storage capacity to each CAM cell, selective bit-wise and word-wise comparisons are enabled. The valid bit storage capacity requires the addition of a second CAM memory core cell to the CAM cell. Multiple examples of such a design are shown in U.S. Pat. No. 6,044,005 entitled "Content Addressable Memory Storage Device." But once the second CAM memory core cell is added to the CAM cell, the CAM cell becomes significantly larger and consumes a great deal of power. When an application requires a very deep CAM, as is common in modern communications applications, the result is a large and power-hungry CAM.

In addition, the conventional schemes for implementing a match line chain do not work well for CAMs that need to operate at lower voltages. Each time the match line goes through N-channel FET 136 inside each CAM cell, a threshold and a body effect of the N-channel FET 136 need to be regenerated. Thus, the match line will not reach the power supply voltage level VDD upon a match, but will only reach a lower voltage, VDD minus a threshold and minus a body effect voltage. Devices that require deep CAMs, such as modern telecommunications equipment, are continually being designed with more restrictive power consumption constraints and thus need to operate at lower voltages. As the voltage used for running the CAM goes down, such conventional CAM designs impair performance.

It would therefore be advantageous to provide a CAM cell design and a method of pre-charge and comparison timing to solve the problems with conventional CAM design.

SUMMARY OF THE INVENTION

The invention is directed in one aspect to a content addressable memory cell for use in a content addressable memory (CAM).

In one embodiment, a CAM cell includes a comparison bit line and a first CAM memory core cell configured to store data. The CAM cell further includes comparison circuitry, grounding circuitry, and a first P-channel transistor configured to communicate a comparison result to a match line using the Miller effect. The comparison circuitry is coupled with the comparison bit line, the grounding circuitry and the first CAM memory core cell, and the first P-channel transistor is coupled with the comparison circuitry.

In another embodiment, a CAM cell for use in a CAM having full bit-wise and word-wise masking capability includes a positive comparison bit line, a negative comparison bit line, a first dual-ended CAM memory core cell configured to store data, and a second dual-ended CAM memory core cell configured to store masking data. The CAM cell further includes comparison circuitry, grounding circuitry, a first P-channel transistor configured to communicate a comparison result to a match line using the Miller effect, and a second P-channel transistor configured to communicate a masked state to the match line. The comparison circuitry is coupled with the positive comparison bit line, the negative comparison bit line, the grounding circuitry, and the first CAM memory core cell. The first P-channel transistor is coupled with the comparison circuitry, and the second P-channel transistor is coupled with the second CAM memory core cell and the grounding circuitry.

In this embodiment, the grounding circuitry within the CAM cells making up a partial word of memory are coupled in parallel. This enables fast and efficient discharge of a local match and simplified pre-charging of the local match.

A method is also provided for operating a CAM having CAM cells that employ P-channel transistors to communicate comparison results to match lines. By operating the CAM in this fashion, faster operation of the CAM at lower voltages may be experienced. The method preferably includes the step of discharging a match line input to VSS, thereby causing intermediate nodes on a match line to discharge to a voltage level just above VSS during normal operation. The intermediate nodes lie between CAM cells having P-channel transistors connected in series on the match line, and the discharging occurs in part via grounding circuitry included within these CAM cells. The method preferably further includes transitioning comparison inputs to the CAM cells to initiate a comparison operation. The transitioning occurs at substantially the same time for each of the comparison inputs. The method preferably further includes the steps of charging the match line input to VDD during the comparison operation, and utilizing the Miller effect to stop a signal flow from passing through one of the CAM cells when that CAM cell identifies a mismatch for the comparison operation.

A method of designing a CAM to allow faster operation at lower voltages is also provided. The method preferably includes the step of connecting CAM cells that employ P-channel transistors to communicate comparison results to match lines and employ grounding circuitry such that, during normal operation, intermediate nodes between CAM cells in a match line chain do not drop all the way to VSS before a compare operation. The method preferably further includes coupling a match line input with a pre-charge line and with a match line for the CAM cells in the match line chain such that the match line input is electrically switched from a connection with VSS to a connection with VDD during the compare operation. The method preferably further includes the step of designing driver circuits that allow transitioning of comparison inputs to the CAM cells in the match line chain to be performed nearly simultaneously. The driver circuits are coupled with the pre-charge line such that a Miller effect may be used during the compare operation to stop a signal flow from passing through one of the CAM cells in the match line chain when that CAM cell identifies a mismatch.

Further features and advantages of the invention as well as the structure and operation of various embodiments of the invention are described in detail below with reference to the accompanying drawings.

DETAILED DESCRIPTION OF THE PREFERRED EMBODIMENTS

Various embodiments as described herein are directed toward CAM design, and more particularly towards the goal of building smaller, more efficient CAM cells for use in CAMs capable of full bit-wise and word-wise masking. Certain embodiments are disclosed and described herein in terms of a CAM enabling full bit-wise and word-wise masking. However, after reading this description it will become apparent to one skilled in the art that the invention may be implemented in various alternative embodiments and alternative applications. For example, certain embodiments may be applicable to CAM cells that include only one CAM memory core cell, as well as CAM cells with multiple CAM memory core cells. In addition, certain embodiments are disclosed and described herein in terms of all the circuits connected between VDD and ground, but alternately an offset voltage VSS other than zero volts may be used instead of ground. The description of the preferred embodiment should not be construed to limit the scope and breadth of the present invention.

Figure 2:
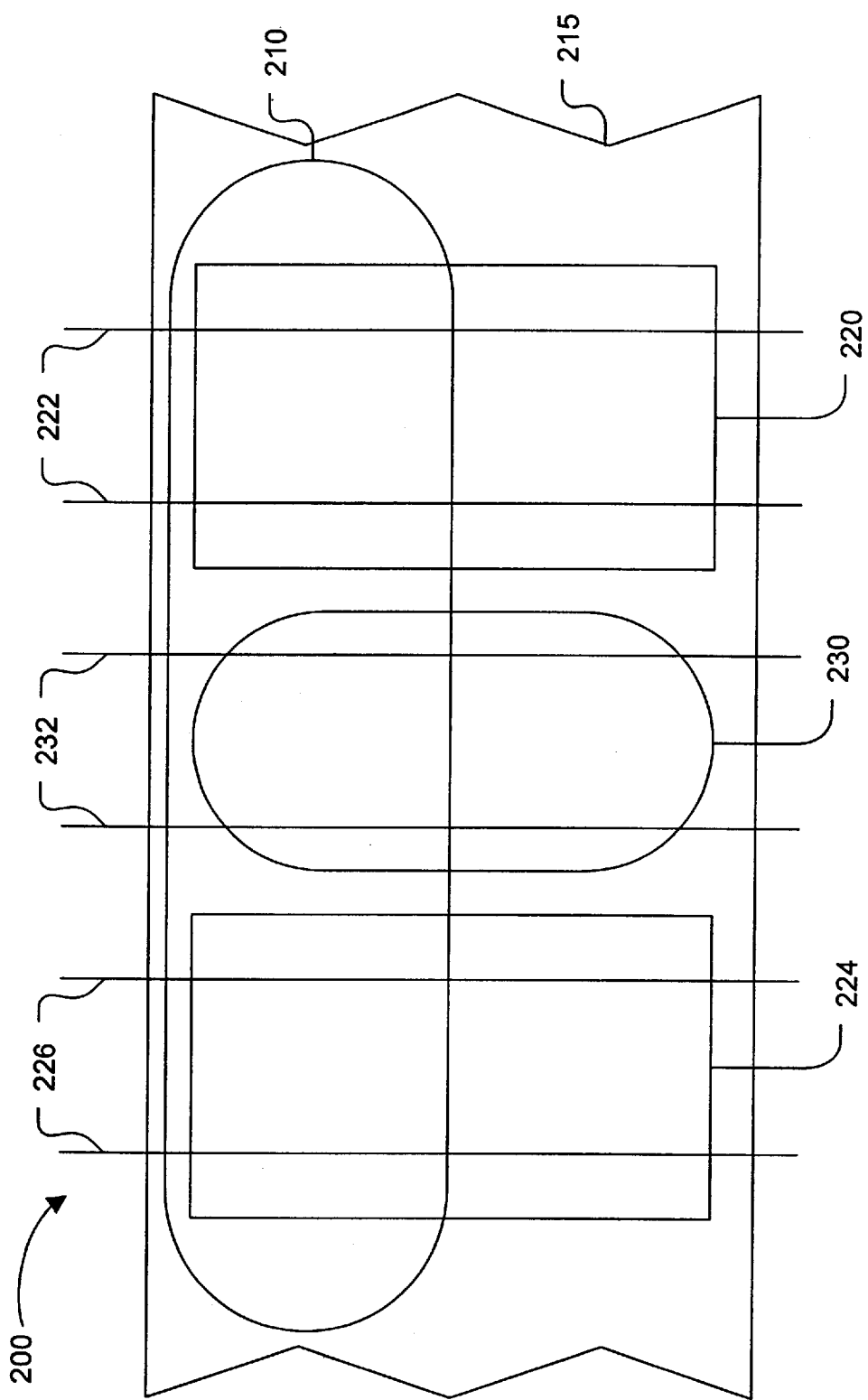
FIG. 2 is a block diagram illustrating a top-down view of a placement of various components of a content addressable memory cell on a complementary metal oxide semiconductor (CMOS) wafer according to a preferred embodiment as disclosed herein.

FIG. 2 is a block diagram illustrating a top-down view of a placement of various components of a content addressable memory cell on a complementary metal oxide semiconductor (CMOS) wafer according to a preferred embodiment as disclosed herein. FIG. 2 shows only a portion of a CMOS wafer 200. The CMOS wafer 200 comprises a positive-type metal-oxide semiconductor substrate 215 (P-type substrate) and a negative-type metal-oxide semiconductor well 210 (N-well). Nearly all modern CMOS designs use a P-type substrate for reasons well understood in the art, and thus the description herein is presented in these terms. But those skilled in the art will understand that the inventive concepts may apply also to CMOS designs using an N-type substrate and a P-well.

Within the CMOS wafer 200 are various components of a CAM cell, capable of full bit-wise and word-wise masking. A first component block 220 contains a data CAM memory core cell for storing and accessing a data bit. A second component block 224 contains a mask CAM memory core cell for storing and accessing a masking bit. By placing the first component block 220 and the second component block 224 side by side, parallel access to the data bit and the masking bit may be had via a pair of differential data bit lines 222 and a pair of differential mask bit lines 226.

Figure 1:
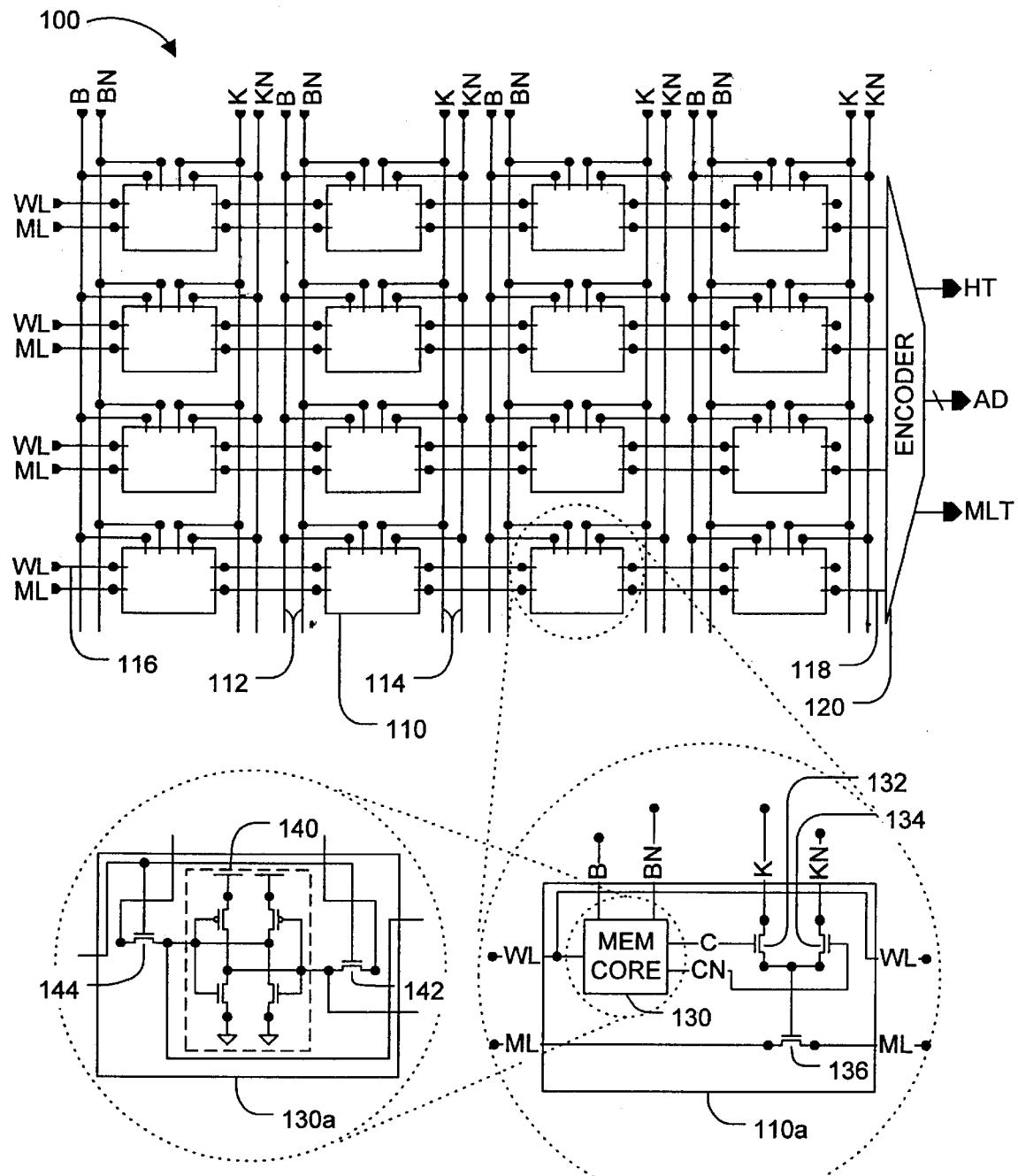
FIG. 1 is schematic block diagram illustrating a simple example of a conventional content addressable memory (CAM) utilizing dual-ended logic, with enlargements illustrating further details of a CAM cell and a CAM memory core cell.

In one embodiment, the two CAM memory core cells within the first and second component blocks 220 and 224 comprise a pair of cross-coupled inverters and two N-channel transistors. This traditional design for a CAM memory core cell is shown in FIG. 1 as the CAM memory core cell 130a. Thus in one embodiment, the two CAM memory core cells within the first and second component blocks 220 and 224 each consist of two P-channel transistors and four N-channel transistors.

This placement of the first and second component blocks 220 and 224 creates a space in which to place a third component block 230 containing comparison logic and match line transistors for the CAM cell. The comparison logic within the third component block 230 is accessed via a pair of differential compare bit lines 232.

In traditional CMOS CAM cell design, the third component block 230 either uses all N-channel transistors, thereby wasting space in a full bit-wise and word-wise masking CAM by leaving a significant portion of the N-well 210 unused, or else uses a large number of P-channel and N-channel transistors to implement pre-charging and resetting functions. In both cases, the resulting CAM cell is large and wasteful of power. Moreover, the traditional all N-channel transistor design cannot utilize this wasted space by introducing a "dog-bone" of P-substrate into the N-well because the width of the third component block 230 is already less than three microns in traditional CAM cells. The space required to transition from an N-channel transistor to an N-well is about one micron, thus introducing a dog-bone does not create any significantly useable space.

In contrast, various embodiments as described herein help minimize the area consumed by the third component block 230 in at least two ways. First, the comparison logic is preferably placed entirely within the P-substrate 215, with no extra transistors for resetting and only two N-transistors for use in pre-charging. Second, the match line transistors are preferably placed entirely within the N-well 210. This design allows a significant reduction in the height and width of the CAM cell, thereby reducing the length of the bit lines 222, 226 and 232, and reducing the length of a word line (not shown) and a match line (not shown) running through the CAM cell. In this fashion, the size of the CAM cell can be reduced, thereby also reducing parasitic capacitance. This design provides reduced power consumption and increased operation speeds.

Figure 3:
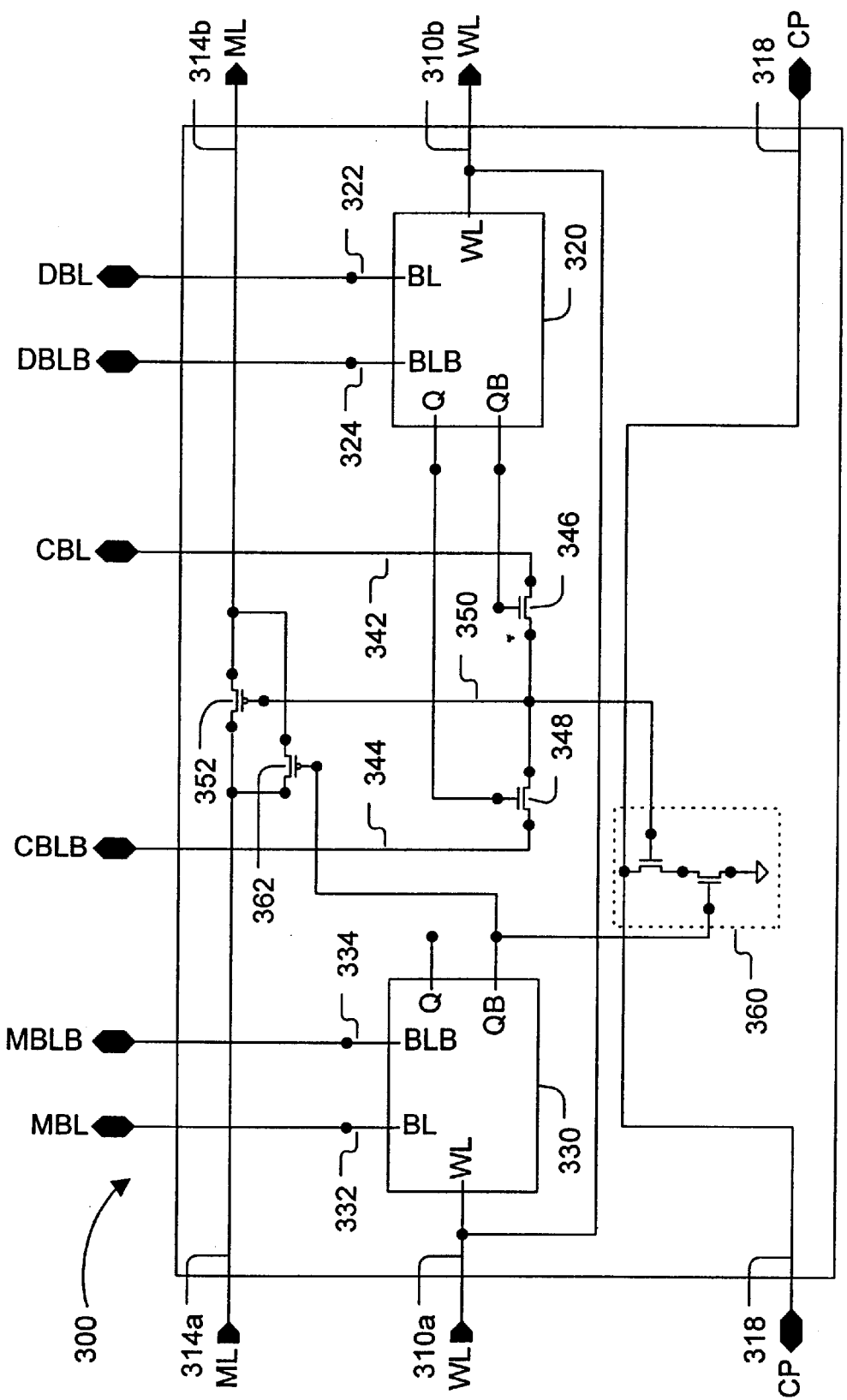
FIG. 3 illustrates a content addressable memory cell according to one embodiment.

FIG. 3 illustrates a content addressable memory cell according to one embodiment. In FIG. 3, a CAM cell 300 includes a plurality of bit lines (e.g., 6), a match line and a word line. A pair of differential data lines 322 and 324, coupled with a Data Bit Line (DBL) and a Data Bit Line Bar (DBLB), provide read and write access of a data bit for the CAM cell 300. A pair of differential mask lines 332 and 334, coupled with a Mask Bit Line (MBL) and a Mask Bit Line Bar (MBLB), provide read and write access of a masking bit for the CAM cell 300. A pair of differential compare lines 342 and 344, coupled with a Compare Bit Line (CBL) and a Compare Bit Line Bar (CBLB), provide dual access to compare logic within the CAM cell 300.

Although the CAM cell 300 is shown in FIG. 3 as having only one sided access to the differential data lines 322, 324, 332, 334, 342, and 344, in most implementations the differential data lines pass straight through the CAM cell 300. This is done to minimize parasitic capacitance as is well understood in the art.

A word line (WL) input 310a provides a control input to CAM memory core cells within the CAM cell 300. A WL output 310b passes this same control input on to additional CAM cells. In an alternative embodiment, the WL output 310b is not present.

A match line (ML) input 314a provides a signal to the CAM cell 300, which is either stopped or allowed to pass to a ML output 314b. In a preferred embodiment, the connection between the ML input 314a and the ML output 314b is established in two different situations: (1) the stored data bit matches the compare bit during a comparison operation, or (2) the stored masking bit is a logical "1."

Although the CAM cell 300 is shown in terms of having an input match line and an output match line, those skilled in the art will understand that alternative signal configurations may be used in CAM cell 300. Thus, alternative embodiments include those in which the ML output 314b is an input, and the ML input 314a is an output. In general, the ML input 314a and the ML output 314b can be thought of collectively as simply the match line 314.

A compare parallel (CP) line 318 provides a complement to the match line 314. The CP line 318 is coupled with grounding circuitry 360. In one embodiment, the grounding circuitry 360 includes two N-channel transistors.

The CAM cell 300 preferably includes a first CAM memory core cell 320 configured to store the data bit. The first CAM memory core cell 320 includes a first data line BL coupled with the positive bit line 322 and a second data line BLB coupled with the negative bit line 324. The first CAM memory core cell 320 also includes a first control input WL coupled with the WL input 310a, a first data output Q, and a second data output QB. The first CAM memory core cell 320 can be implemented using any number of designs, but preferably it is a relatively simple design, such as that shown in FIG. 1, using a minimum of transistors. A memory element within the first CAM memory core cell 320 can be implemented using any number of devices, such as dynamic or volatile memory devices, but preferably it is a static memory device, using a minimum number of transistors, such as that shown in FIG. 1.

The CAM cell 300 also includes comparison logic comprising a first N-channel transistor 346 and a second N-channel transistor 348. The first N-channel transistor 346 couples the positive comparison bit line 342 with a match control line 350 and is gated by the second data output QB. The second N-channel transistor 348 couples the negative comparison bit line 344 with the match control line 350 and is gated by the first data output Q. Thus, during a compare operation, if the first CAM memory core cell 320 contains a logical "1", the second N-channel transistor 348 allows the signal on the negative comparison bit line 344 to pass to the match control line 350, and if the first CAM memory core cell 320 contains a logical "0", the first N-channel transistor 346 allows the signal on the positive comparison bit line 342 to pass to the match control line 350.

During a compare operation, the match control line 350 switches to a logical "0" when there is a match between the stored data bit and a compare bit, and the match control line 350 stays at a logical "1" when there is not a match between the stored data bit and the compare bit. The match control line 350 gates a first P-channel transistor 352, which connects the ML input 314a with the ML output 314b. Thus when there is a match between the stored data bit and the compare bit, the first P-channel transistor 352 allows an input signal on the ML input 314a to pass to the ML output 314b. The match control line 350 is coupled with the grounding circuitry 360.

Preferably, both the first N-channel transistor 346 and the second N-channel transistor 348 are zero threshold transistors.

The CAM cell 300 includes a second CAM memory core cell 330 configured to store the masking bit. The second CAM memory core cell 330 includes a third data line BL coupled with the positive mask line 332 and a fourth data line coupled with the negative mask line 334. The second CAM memory core cell 330 also includes a second control input WL coupled with the WL input 310a, a third data output Q, and a fourth data output QB. The second CAM memory core cell 330 can be implemented using any number of designs, but preferably it is a simple design, such as that shown in FIG. 1, using a minimum of transistors. A memory element within the second CAM memory core cell 330 can be implemented using any number of devices, such as dynamic or volatile memory devices, but preferably it is a static memory device, using a minimum of transistors, such as that shown in FIG. 1.

The fourth data output QB gates a second P-channel transistor 362. The second P-channel transistor 362 connects the ML input 314a with the ML output 314b. Thus when the masking bit stored in the second CAM memory core cell 330 is a logical "1", the second P-channel transistor 362 allows an input signal on the ML input 314a to pass to the ML output 314b. In addition, the fourth data output QB is coupled with the grounding circuitry 360.

Although the CAM cell 300 is disclosed and described in terms of dual-ended logic, those skilled in the art will understand that it can also be implemented using single-ended logic.

Figure 4:
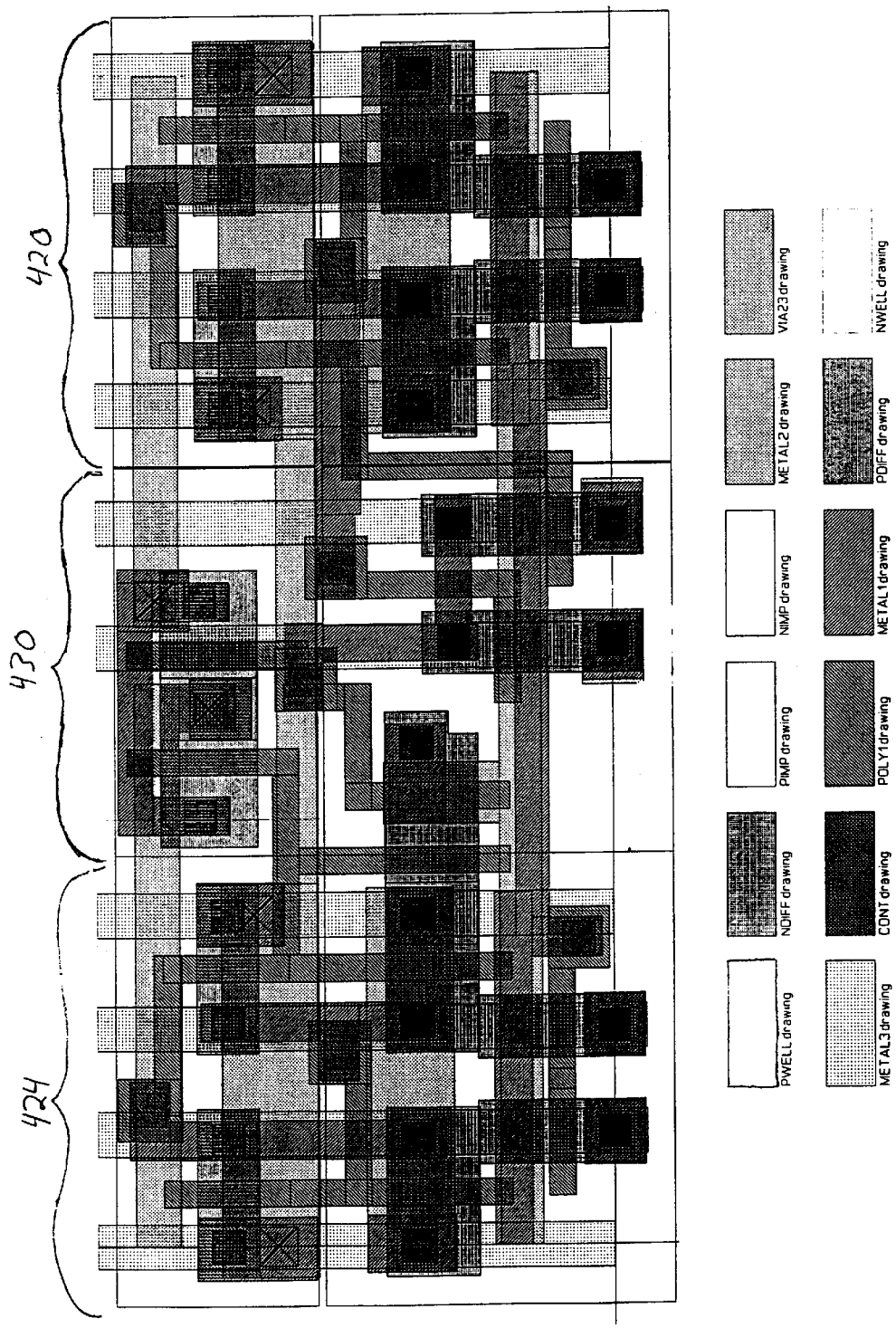
FIG. 4 is a layout design for a content addressable memory cell according to one embodiment.

FIG. 4 is a layout design for a content addressable memory cell according to one embodiment. In FIG. 4, a first component block 420 contains the first CAM memory core cell for storing and accessing the data bit. A second component block 424 contains the second CAM memory core cell for storing and accessing the masking bit. Finally, a third component block 430 contains the comparison logic for the CAM cell, the first P-channel transistor and the second P-channel transistor.

In the course of creating a design layout for the schematic shown in FIG. 3, parasitic capacitance is introduced. In practice, the circuit is laid out in such a fashion that the parasitic capacitance is minimized. Those skilled in the art understand the process for doing this using standard design tools. FIG. 4 is presented to show an example layout for a properly minimized CAM cell according to one embodiment of the present invention.

Figure 5:
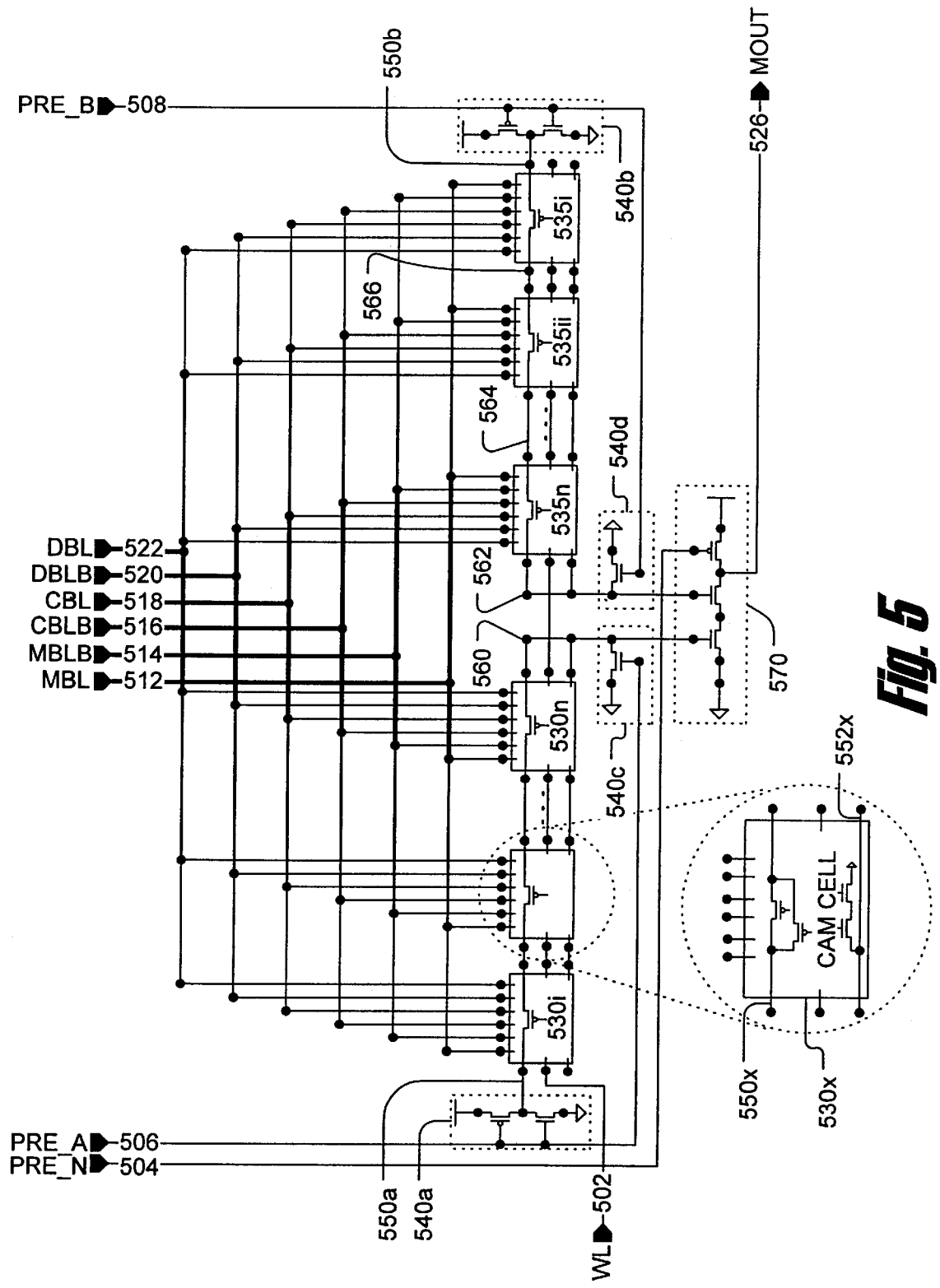
FIG. 5 illustrates a match line chain of content addressable memory cells making up a partial word of memory in a content addressable memory according to one embodiment.

FIG. 5 illustrates a match line chain of content addressable memory cells making up a partial word of memory in a content addressable memory according to one embodiment. In FIG. 5, a CAM cell 530x may be embodied as CAM cell 300 in FIG. 3 or any other suitable CAM cell. The CAM cell 530x includes data, mask and compare lines, DBL, DBLB, MBL, MBLB, CBL, and CBLB. The CAM cell 530x also includes a word line WL, a match line 550x and a compare parallel line 552x.

The CAM cell 530x is representative of CAM cells making up the partial word of memory in the CAM. The partial word of memory is split up into two halves. A first half is shown as CAM cells 530i through 530n. A second half is shown as CAM cells 535i through 535n. The particular number of CAM cells in each half of the partial word is selected depending upon the performance needs of a particular application. In one embodiment, the first half (530i through 530n) consists of six CAM cells, and the second half (535i through 530n) also consists of six CAM cells.

The first half of the partial word of memory comprises a plurality of CAM cells 530 arranged in series, having a source match line input 550a. The source match line input 550a is pre-charged low. (It should be noted that the term "pre-charge" as used herein designates operations with both charging and discharging components and designates lines that cause discharging as well as lines that cause charging.) In addition, the source match line input 550a is charged high at the beginning of a compare operation. This is accomplished using a left-side pre-charge circuit 540a. The left-side pre-charge circuit 540a preferably comprises an N-channel transistor connecting the source match line input 550a with ground and a P-channel transistor connecting the source match line input 550a with VDD. Both the N-channel transistor and the P-channel transistor are gated by a pre-charge A input 506.

Bringing the pre-charge A input 506 high initiates the pre-charge operation. The left-side match line is substantially discharged through the left-side pre-charge circuit 540a. Moreover, the left-side match line is also discharged through the grounding circuitry within the CAM cells 530. This grounding circuitry is coupled with a left-side output 560, thereby connecting the left-side match line with ground.

The left-side match line need only be discharged from one side, but preferably the two-sided discharge design is used to increase the speed and efficiency of the pre-charge operation. In particular, the use of the grounding circuitry within the CAM cells 530 avoids the charge sharing problems, which can be caused by particular match/mismatch history. For example, if the second to last comparison resulted in a mismatch on all CAM cells 530, and the last comparison resulted in a match on one of the CAM cells 530, when the pre-charge begins, the CAM cells 530 begin storing charge. Using the grounding circuitry within the CAM cells 530 avoids this problem. Moreover, in one embodiment, a second left-side pre-charge circuit 540c may be used to complement the functions of the left-side pre-charge circuit 540a and help ensure reduced charge storing problems. In this embodiment, the grounding circuitry may not be needed.

Although the left-side pre-charge circuit 540a is described in terms of specific transistors, it will be understood by those skilled in the art that alternative P and N-channel configurations may be used, depending on the particular CAM layout.

The portions of the left-side match line that are charged to a logical "1" in a compare operation are generally also the only portions of the match line that need to be discharged. These portions of the match line are defined by the CAM cells 530 matched or masked in the prior comparison operation. Since these CAM cells are still on at the end of the comparison, the substantial discharge of these portions can be accomplished by careful timing alone. This timing allows improvement in CAM speed and is described in further detail below.

During a compare operation, the source match line input 550a is brought high. Thus, if a match or a mask occurs within each CAM cell 530, the left-side output 560 switches to a high state. In alternative embodiments, the configuration can be reversed such that the left-side output 560 is brought high during a compare operation, and the source match line input 550a switches to a high state upon a match or a mask result in each CAM cell 530.

The second half of the partial word of memory comprises a plurality of CAM cells 535 arranged in series. The pre-charge and compare operations for the second half preferably function in an analogous fashion as those for the first half. A right-side pre-charge circuit 540b functions in the same fashion as the left-side pre-charge circuit 540a. In one embodiment, a second right-side pre-charge circuit 540d functions in the same fashion as the second left-side pre-charge circuit 540c. A right-side source match line input 550b functions in the same fashion as the source match line input 550a. The right-side pre-charge circuit 540b is responsive to a pre-charge B input 508. In an alternative embodiment, the pre-charge B input 508 and the pre-charge A input 506 are one and the same.

During a compare operation, if a match or a mask occurs within each CAM cell 535, a right-side output 562 switches to a high state. If both the left-side output 560 and the right-side output 562 go high during a compare operation, the partial word matches the comparand (with possibly some of the bits appropriately masked out from the comparison). The results of this comparison are fed to a modified NAND gate 570. The modified NAND gate 570 has the left-side output 560 and the right-side output 562 as inputs and a match output (MOUT) 526 as its output.

In a preferred embodiment, the modified NAND gate 570 comprises two N-channel transistors and a P-channel transistor coupled in series. A first N-channel transistor connects ground with a second N-channel transistor and is gated by the left-side output 560. The second N-channel transistor connects the first N-channel transistor with the MOUT 526 and is gated by the right-side output 562. The P-channel transistor connects the MOUT 526 with VDD and is gated by a pre-charge negative (PRE_N) input 504.

In an alternative embodiment, the modified NAND gate 570 is a NAND gate. In this alternative embodiment, there is no PRE_N input 504, and there are no second left and right-side pre-charge circuits 540c, 540d.

During a pre-charge operation, the PRE_N input 504, the left-side output 560 and the right-side output 562 all go low. Thus, the MOUT 526 is pre-charged high, indicating no match for the partial word. During a compare operation, if both the left-side output 560 and the right-side output 562 go high, a connection is established from the MOUT 526 to ground. Thus, the MOUT 526 is discharged, indicating that a match has occurred for the partial word (with possibly some of the bits appropriately masked out from the comparison).

In addition to the elements disclosed above, the partial word of the CAM shown in FIG. 5 also includes the appropriate inputs. Word line input 502 is provided as input for the CAM cell 530$i$. Alternative embodiments include other word line configurations, such as the word line input 502 being separately provided to the CAM cell 530$i$ and the CAM cell 535$i$, wherein the connection between the CAM cell 530$n$ and the CAM cell 535$n$ is eliminated. Mask lines 512 and 514 provide MBL and MBLB connections to the CAM cells 530 and 535. Compare bit lines 516 and 518 provide CBLB and CBL connections to the CAM cells 530 and 535. Data lines 520 and 522 provide the DBLB and DBL connections to the CAM cells 530 and 535. All of the input lines 512, 514, 516, 518, 520, and 522 are multi-line busses that split and provide appropriate single bit inputs to each of the CAM cells 530 and 535.

As previously described, the CAM cells 530 and 535 employ P-channel transistors in the match line chain. In conventional designs, this use of P-channel transistors would create problems in the match line chain because P-channel transistors are generally difficult to turn off once they are on. These problems are turned to advantages according to the CAM cell design methodologies described herein.

Referring once again to FIG. 3, the second P-channel transistor 362 does not cause a problem because it is gated by a latch that swings all the way to VDD. Thus, when the mask bit stored in the second CAM memory core cell 330 is set to zero, the QB output goes to VDD, and the second P-channel transistor 362 is fully turned off. The first P-channel transistor 352, however, is gated by the match control line 350. At the end of a pre-charge operation, the match control line 350 is connected with VDD through either the first N-channel transistor 346 or the second N-channel transistor 348. In either event, the match control line 350 does not rise to VDD but only to VDD minus an N-transistor threshold and body effect voltage. Thus, at the end of the pre-charge operation, the first P-channel transistor 352 is only substantially turned off and allows leakage across the match line.

Moreover, during the pre-charge operation, intermediate nodes in the match line chain are not fully discharged. Referring now to FIG. 5, an intermediate node 566 is discharged through a P-channel transistor during a pre-charge operation. Thus, the intermediate node 566 does not go to ground, but goes to a voltage equal to the threshold of the P-channel transistor plus a body effect. This is true for all intermediate nodes 564 in the match line chain. In one embodiment, at the end of the pre-charge operation, the intermediate nodes 564 will end up at about seven hundred mV (after a couple of compare operations have been performed).

This particular voltage level value for the intermediate nodes 564 is based on a design process for creating CAM cells that operate with a VDD of 1.8 V and a VSS of 0.0 V, but another intermediate node voltage may be arrived at depending upon the combinations of VDD, VSS and other factors. Generally speaking, the voltage level for the intermediate nodes 564 will be roughly about 30–60% of the voltage difference between VDD and VSS, plus VSS.

Ordinarily, P-channel transistors used in the foregoing manner could allow leakage of current onto the left-side output 560 and the right-side output 562, thereby risking an indeterminate state in the modified NAND gate 570. In addition, during a compare operation, a P-channel transistor in the match line chain could allow a signal to substantially pass when that bit is in fact mismatched and not masked. This could create a match signal on the MOUT 526 when there is no match of the partial word. These potential problems are turned to advantages using careful timing.

Figure 6:
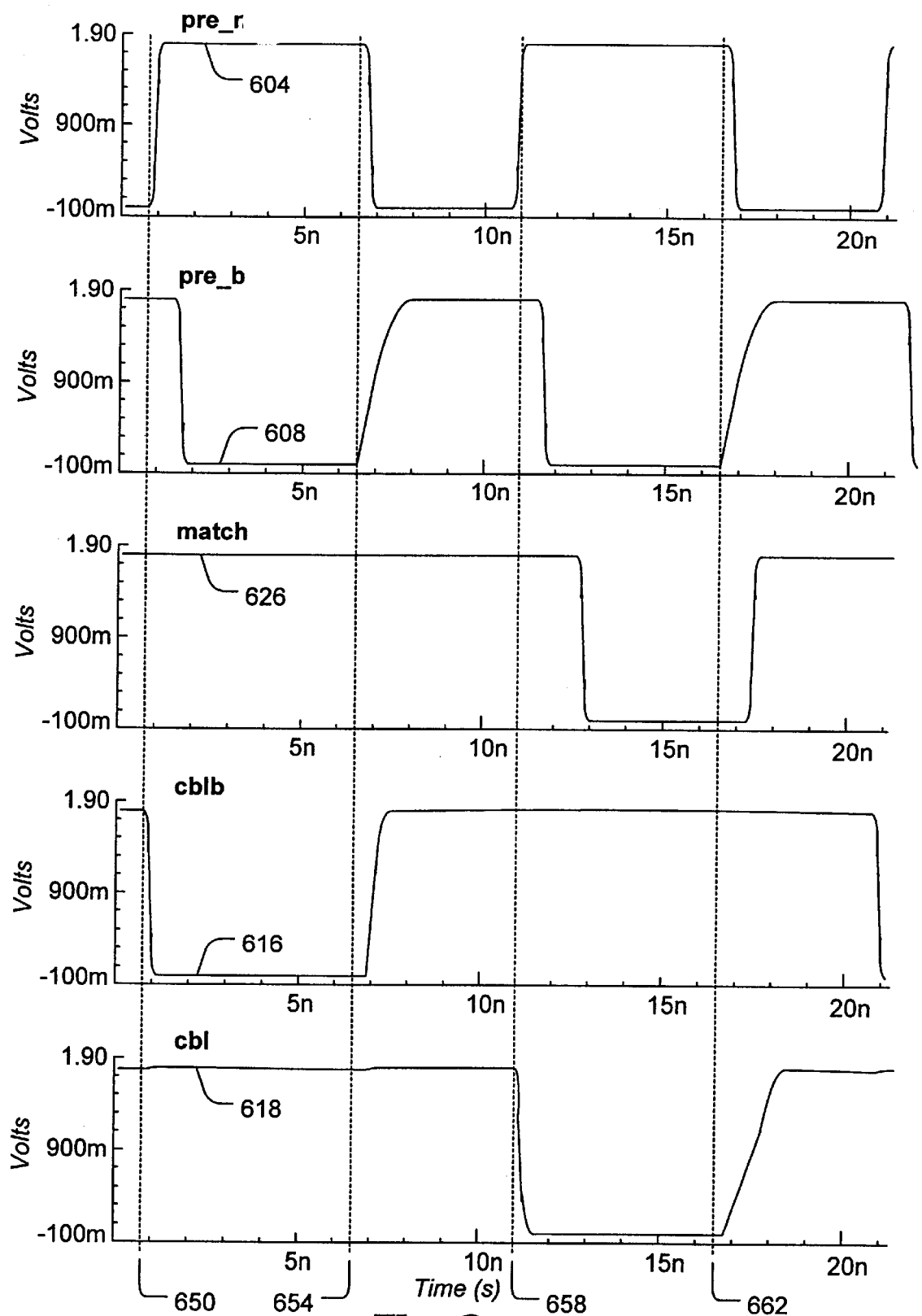
FIG. 6 is a set of five graphs illustrating a timing sequence for pre-charge and compare operations on a match line chain of content addressable memory cells making up a partial word of memory in a content addressable memory according to one embodiment.

FIG. 6 is a set of five graphs illustrating a timing sequence for pre-charge and compare operations on a match line chain of content addressable memory cells making up a partial word of memory in a content addressable memory according to one embodiment. Referring now to FIGS. 6 and 5, a pre_n signal 604 represents a signal on the PRE_N input 504, a pre_b signal 608 represents a signal on the pre-charge B input 508, and a match signal 626 represents a signal on the MOUT 526. A compare_bar signal 616 represents the single bit input to the CAM cell 535$ii$ from the Compare Bit Line Bar 516, and a compare signal 618 represents the single bit input to the CAM cell 535$ii$ from the Compare Bit Line 518.

At time equal to zero, the partial word of memory in the CAM is ready for a comparison operation. At time point 650, a comparison operation begins by pushing the pre_n signal 604 high and pushing the compare_bar signal 616 low. Pushing the pre_n signal 604 high shuts off the connection between VDD and the MOUT 526 in the modified NAND gate 570. Pushing the compare_bar signal 616 low indicates that the comparand has a "1" in the position corresponding to the CAM cell 535$ii$.

For a compare operation, the pre_n signal 604 is preferably raised high at the same time or before the pre_b signal 608 is brought low. This is to ensure that the connection to VDD in the modified NAND gate 570 is turned off before there is even the possibility of a match in the partial word of CAM memory, thereby preventing a short. This initial assertion of the pre_n signal 604 can be important in the foregoing exemplary bit-wise masking embodiment because it is possible that all the bits are masked in the CAM cells 530 and 535 at the beginning of the compare operation. In this exemplary embodiment, there is approximately a one nanosecond delay between the pre_n signal 604 going high and the pre_b signal 608 going low. Thus, the pre_n signal 604 is slightly biased with respect to the pre_b signal 608.

When the pre_b signal 608 is brought low, the right-side source match line input 550$b$ is disconnected from ground and connected VDD. The right-side source match line input 550$b$ rises to VDD relatively quickly. This is true even if a number of the CAM cells at the beginning of the partial word, such as CAM cells 535$i$ and 535$ii$, are on at the beginning of the compare operation. The P-channel transistors inside the CAM cells 530 and 535 are relatively small, and thus the match line will charge up in short order.

In this example compare operation, the CAM cell 535$ii$ is not masked, and it has its CBLB input going low, thereby indicating that the comparand has a "1" in the position corresponding to the CAM cell 535$ii$. The CAM cell 535$ii$ contains a "0", thus its compare circuitry causes its match control line to stay at a logical "1" (which is VDD minus a threshold and minus a body effect voltage). This logical "1" keeps the first P-channel transistor inside CAM cell 535$ii$ turned substantially off. This first P-channel transistor is not, however, completely off.

As the right-side source match line input 550$b$ rises, the CAM cell 535$i$, which contains a data bit that matches with the compare input, allows this rising signal to charge the intermediate node 566 from around seven hundred mV (according to the stated example) to VDD. This voltage rise on the intermediate node 566 couples onto the match control line inside the CAM cell 535ii because of the Miller effect. The Miller effect is caused by the presence of an effective capacitance at the junction of a transistor, which is operating as a reverse-biased diode. This capacitance can cause the collection of a Miller charge under certain conditions. Because the match control line inside the CAM cell 535ii has only two small N-channel transistors attached to it, the Miller charge will not pass back through the N-channel transistor that is turned on. Thus, the Miller effect causes the voltage on the match control line to be pushed even higher (although not quite to VDD), thereby effectively shutting the first P-channel transistor off and stopping the flow of current that would otherwise signal a match where none occurred. Some current from the intermediate nodes 564 still leaks through to the right-side output 562, but this leakage is low enough that the right-side output 562 stays low long enough to complete the compare operation.

Because the Miller effect is being used to shut off the appropriate P-channel transistors in the match line, it is important that all the CAM cells in the match line be turned on at the same time. This requirement means that the compare bit lines 516 and 518 should deliver their single bit inputs, at the beginning of the compare operation, to all the CAM cells 535 in the right-side match line chain at essentially the same time. This simultaneous time delivery is, however, subject to an RC delay caused by inherent resistances and capacitances along the match line. Likewise, the compare bit lines 516 and 518 should deliver their single bit inputs to all the CAM cells 530 in the left-side match line chain at essentially the same time. With this simultaneous timing, the Miller effect causes "boot strapping" of the voltage on the match control line inside the first CAM cell in the match line chain to identify a no match condition, thereby avoiding unwanted propagation of the match signal.

A mismatch in CAM cell 535ii means that the partial word does not match the comparand. The match signal 626 on the MOUT 526 stays high between time 650 and time 654, indicating no match for the partial word.

At time 654, a pre-charge operation begins by pushing the pre_b signal 608 high. This operation disconnects the right-side source match line input 550b from VDD and connects it instead to ground. Additionally, in one embodiment, this operation connects the right-side output 562 to ground. The right-side output 562 discharges to zero volts, as does the right-side source match line input 550b. The intermediate node 566 discharges from VDD to around seven hundred mV (according to the stated example). This is true despite the fact that the first P-channel transistor inside CAM cell 535i starts being turned off shortly after time 654. The first P-channel transistor inside the CAM cell 535i, which was on in the last compare operation, is relatively small, and the match control line inside the CAM cell 535i cannot be brought high enough to completely turn of the first P-channel transistor inside CAM cell 535i. Thus, the intermediate node 566 drops to about seven hundred mV relatively quickly. The intermediate nodes 564 likewise drop quickly in voltage to about seven hundred mV when those nodes are charged to VDD in a just-finished compare operation.

In one embodiment, the single bit inputs to all the CAM cells 530 and 535, from the compare bit lines 516 and 518, are pushed high only after a partial delay after time 654. This delay, however, is generally not needed. The compare bit lines 516 and 518 are heavily loaded. Thus they take some time to turn on completely. This gradual timing characteristic of compare bit lines 516 and 518 helps to shorten the time necessary for the pre-charge operation.

The pre_n signal 604 is preferably pushed low shortly after the pre_b signal 608 is pushed high at time 654. Pushing the pre_n signal 604 low reconnects the MOUT 526 with VDD. In one embodiment, the pre_n signal 604 is pushed low only after a partial delay after time 654. If a match had occurred during the previous compare operation, this delay allows the MOUT 526 to contain a valid match signal 626 a little while longer. This provides two main benefits. First, it provides extra time for circuits that are sensing the MOUT 526 down stream. Second, it ensures that no short will be created in the modified NAND gate 570.

At time 658, a second comparison operation begins by pushing the pre_n signal 604 high and pushing the compare signal 618 low. Pushing the pre_n signal 604 high shuts off the connection between VDD and the MOUT 526 in the modified NAND gate 570. Pushing the compare signal 618 low indicates that the comparand has a "0" in the position corresponding to the CAM cell 535ii.

As mentioned previously, for a compare operation, the pre_n signal 604 is preferably pulled high at the same time or before the pre_b signal 608 switches to a low state. This is to ensure that the connection to VDD in the modified NAND gate 570 is turned off before there is even the possibility of a match in the partial word of CAM memory, thereby preventing a short. When the pre_b signal 608 goes low, shortly after time 658, the right-side source match line input 550b is disconnected from ground and connected to VDD. As mentioned above, the right-side source match line input 550b rises to VDD relatively quickly.

In this example compare operation, the CAM cell 535ii is not masked, and it has its CBL input going low, thereby indicating that the comparand has a "0" in the position corresponding to the CAM cell 535ii. The CAM cell 535ii contains a "0", thus its compare circuitry causes its match control line to be pulled to a logical "0". This logical "0" turns on the first P-channel transistor inside CAM cell 535ii.

As the right-side source match line input 550b rises, the CAM cell 535i, which contains a data bit that matches with the compare input, allows this rising signal to charge the intermediate node 566 from around seven hundred mV to VDD. This voltage rise on the intermediate node 566 couples onto the match control line inside the CAM cell 535ii because of the Miller effect. This coupling slows the voltage drop on the match control line, thus slowing the turning on of CAM cell 535ii. Thus, in this case the Miller effect reduces the performance of the CAM.

This reduction in performance, however, is effectively negligible and is far offset by the increased performance of the CAM overall. The reduction is negligible for two reasons. First, turning on P-channel transistors is generally easy, and the P-channel transistors in the match line chain are only substantially turned off (meaning they are almost on). Thus, the effect of the reduced performance is minimal. Second, the intermediate node 566 and the intermediate nodes 564 are not completely at ground. They are partially charged at a voltage level of about seven hundred mV. Thus, these intermediate nodes do not take long to charge up to VDD.

When all the CAM cells 535 turn on, the right-side output 562 is pulled high. In this example run, all the CAM cells 530 and 535 turn on: thus, both the left-side output 560 and the right-side output 562 are brought high. This operation causes the MOUT 526 to be discharged through the modified NAND gate 570. Thus, the match signal 626 drops to zero, thereby indicating a match for the partial word.

At time point 662, a second pre-charge operation begins by pushing the pre_b signal 608 high. This operation disconnects the right-side source match line input 550b from VDD and connects it to ground. Additionally, in one embodiment, this operation connects the right-side output 562 to ground. The right-side output 562 discharges to zero volts, as does the right-side source match line input 550b. The intermediate node 566 discharges from VDD to around seven hundred mV in the stated example. This is true despite the fact that the first P-channel transistor inside CAM cell 535i starts being turned off shortly after time 662. The first P-channel transistor inside the CAM cell 535i, which was on in the last compare operation, is relatively small, and the match control line inside the CAM cell 535i cannot be brought high enough to completely turn of the first P-channel transistor inside CAM cell 535i. Thus, the intermediate node 566 drops to about seven hundred mV relatively quickly. This is also the case for the intermediate nodes 564.

In one embodiment, the single bit inputs to all the CAM cells 530 and 535, from the compare bit lines 516 and 518, are pushed high only after a partial delay after time 662. This delay, however, is generally not needed. The compare bit lines 516 and 518 are heavily loaded. Thus, as before, they take some time to turn on completely.

The pre_n signal 604 is preferably pushed low shortly after the pre_b signal 608 is pushed high at time 662. Pushing the pre_n signal 604 low reconnects the MOUT 526 with VDD. In one embodiment, the pre_n signal 604 is pushed low only after a partial delay after time 662. This delay allows the MOUT 526 to contain a valid match signal 626 a little while longer. Once the pre_n signal 604 goes low, the match signal 626 is recharged to VDD.

Although FIG. 6 shows the timing of two compare and two pre-charge operations according to an exemplary embodiment, the present invention is not limited to the particular timing shown. The general design methodology of using P-channel transistors and the Miller effect to design faster CAMs is applicable to many CAM cell and CAM designs. The proper timing of the pre-charge and compare operations for these CAM cell and CAM designs, to obtain the improved speed and power performance, is readily determinable for a particular CAM structure using standard circuit modeling techniques well known in the art, given the disclosure herein.

In addition, although FIG. 6 shows the timing of an embodiment running with VDD at 1.8 volts and VSS at 0.0 volts, the present invention is not limited to any particular VDD and VSS combination. The voltage difference between VDD and VSS is determined by the process used. The presently preferred process technology results in a CAM core designed for a VDD of 1.8 volts and a VSS of 0.0 volts. But the same CAM core can also be run at 1.9 volts or at 1.5 volts, for example.

Figure 7:
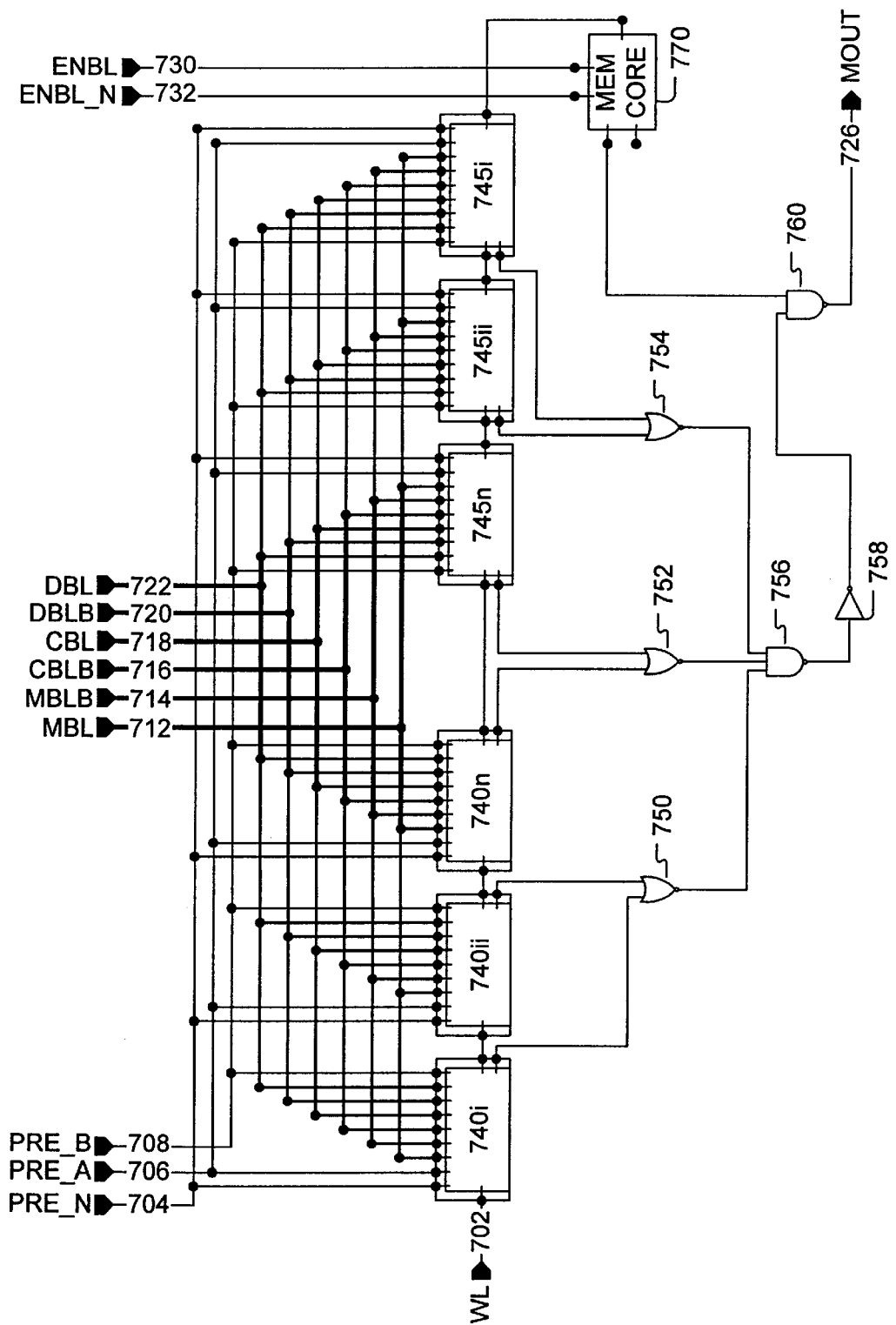
FIG. 7 illustrates a word of memory in a content addressable memory according to one embodiment.

FIG. 7 illustrates a word of memory in a content addressable memory according to one embodiment as disclosed herein. In FIG. 7, the word of memory comprises a set of partial word component blocks, a CAM memory core cell, and hierarchical output logic. The set of partial word component blocks comprise left side blocks 740i through 740n and right side blocks 745i through 745n. In a preferred embodiment, the left side blocks 740i through 740n number three, and the right side blocks 745i through 745n also number three. Each component block from the set of component blocks is a match line chain of CAM cells making up a partial word of memory, as shown in FIG. 5.

The inputs for the word of memory include the appropriate inputs for each component block. A word line input 702 is provided as WL input for the component block 740i. The WL output of each component block is then provided as the WL input to the next component block. Alternative embodiments include other word line configurations. Mask lines 712 and 714 provide mask line connections to the component blocks 740 and 745. Compare lines 716 and 718 provide compare line connections to the component blocks 740 and 745. Data lines 720 and 722 provide data line connections to the component blocks 740 and 745.

An additional, optional enable CAM memory core cell 770 is coupled with two additional inputs, which are differential enable lines 730 and 732. The differential enable lines 730 and 732 allow read and write access to the enable CAM memory core cell 770 for storing an enable bit. The enable CAM memory core cell 770 also includes a WL control input coupled with the WL output of component block 745i. In an alternative embodiment, the WL control input to the enable CAM memory core cell 770 is coupled with a separate control input, thus allowing the enable CAM memory core cell 770 to be controlled separately from the word of memory. The enable bit stored in the enable CAM memory core cell 770 must be set to one for a match line output (MOUT) 726 to be changed from one to zero during a compare operation, thereby indicating a match for the word of memory. Thus, the enable bit allows the CAM to ignore the entire word of memory for one or more compare operations.

The word of CAM memory also comprises hierarchical logic. In an embodiment with three component blocks on both the left and rights sides, such hierarchical logic includes three first level NOR gates. A first NOR gate 750 has two inputs, a first of which is coupled with the MOUT 526 from the component block 740i, and a second of which is coupled with the MOUT 526 from the component block 740ii. The first NOR gate 750 outputs a logical "1" when both of its inputs go to zero, thus indicating that a match has occurred in both component blocks 740i and 740ii (with possibly some of the bits appropriately masked out from the comparison).

A second NOR gate 752 has two inputs, a first of which is coupled with the MOUT 526 from the component block 740n, and a second of which is coupled with the MOUT 526 from the component block 745n. The second NOR gate 752 outputs a logical "1" when both of its inputs go to zero, thus indicating that a match has occurred in both component blocks 740n and 745n (with possibly some of the bits appropriately masked out from the comparison).

A third NOR gate 754 has two inputs, a first of which is coupled with the MOUT 526 from the component block 745ii, and a second of which is coupled with the MOUT 526 from the component block 745i. The third NOR gate 754 outputs a logical "1" when both of its inputs go to zero, thus indicating that a match has occurred in both component blocks 745ii and 745i (with possibly some of the bits appropriately masked out from the comparison).

Following the first level NOR gates, the hierarchical logic further comprises two NAND gates and an inverter 758. A first NAND gate 756 has three inputs, a first of which is coupled with the output from the first NOR gate 750, a second of which is coupled with the output from the second NOR gate 752, and a third of which is coupled with the output from the third NOR gate 754. Thus, when all data bits within the word of memory match the comparand (or are appropriately masked out), an output of the first NAND gate 756 is brought to a logical "0." The output of the first NAND gate 756 is coupled with the inverter 758 such that an output of the inverter 758 goes to logical "1" when the word of memory has matched the comparand. Thus the final hierarchical match line is only switched if there is a full match, thereby saving power.

In alternative embodiments in which more component blocks are used, the hierarchical logic includes additional NAND and NOR gates. These NAND and NOR gates are placed in a stacked layer pattern to avoid having NOR gates with too many inputs. This technique helps avoid the inefficiencies of NOR gates, which are well understood in the art.

Preferably, the hierarchical logic fits within the pitch of the word line, which is usually determined by the CAM cell. Thus, in a preferred embodiment, the hierarchical logic (NANDS, NORS, and inverter(s)) are the same or less in height than the CAM memory core cell, which is typically three microns high. Modern processes typically employ five or six levels of metal, thus implementation of this routing of the hierarchical logic lines is straightforward to those of skill in the art.

In addition, the number of component blocks is preferably even. An even number allows the hierarchical logic to drive to the center, thereby avoiding the need for extra buffers. Moreover, because all the routing through the hierarchical logic is comparatively short, the need for additional transistors is also eliminated. This hierarchical structure saves power by reducing the number of transitions on highly loaded match lines.

A second NAND gate 760 has two inputs, a first of which is coupled with the output from the inverter 758, and a second of which is coupled with a Q node of the enable CAM memory core cell 770. Thus, the MOUT 726 for the entire word of CAM memory switches to a logical "0" when the entire word matches the comparand (taking masking bits into account), and the enable bit is set to one. Additionally, the MOUT 726 stays at a logical "1" when the word of memory does not match the comparand, or when the enable bit is set to zero.

The word of memory shown in FIG. 7 is a word of memory in a CAM, which can be made very deep and is capable of full bit-wise and word-wise masking. Very deep CAMs frequently have very poor worst case power consumption characteristics (worst case for a CAM is matches everywhere). This worst case power consumption can be reduced by reducing the voltage swing on the inputs for each word of memory in the CAM. This reduction in input voltage swing is readily accomplished by modifying the driver circuits for the CAM word inputs. Those skilled in the art understand how to perform these modifications using standard design tools, such as the Simulation Program with Integrated Circuit Emphasis (SPICE).

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A content addressable memory (CAM) cell comprising:
    a comparison bit line;
    a first CAM memory core cell configured to store data;
    comparison circuitry coupled with the comparison bit line and the first CAM memory core cell;
    a first P-channel transistor configured to communicate a comparison result to a match line using the Miller effect, the first P-channel transistor being coupled with the comparison circuitry; and
    grounding circuitry coupled with a ground and the comparison circuitry.

2. The CAM cell of claim 1, further comprising:
    a second CAM memory core cell configured to store masking data, the second CAM memory core cell being coupled with the grounding circuitry; and
    a second P-channel transistor configured to communicate a masked state to the match line, the second P-channel transistor being coupled with the second CAM memory core cell.

3. The CAM cell of claim 2, wherein the first CAM memory core cell comprises a random access memory core cell, and wherein the second CAM memory core cell comprises a random access memory core cell.

4. The CAM cell of claim 2, wherein the grounding circuitry comprises:
    a first N-channel transistor configured to connect a compare parallel line with ground through a second N-channel transistor, the first N-channel transistor being coupled with the match control line; and
    the second N-channel transistor configured to connect the first N-channel transistor with ground, the second N-channel transistor being coupled with the second CAM memory core cell.

5. The CAM cell of claim 2, wherein the comparison bit line is a positive comparison bit line, the first CAM memory core cell is dual-ended, the CAM cell further comprising a negative comparison bit line coupled with the comparison circuitry.

6. The CAM cell of claim 5, wherein the second CAM memory core cell is dual-ended.

7. The CAM cell of claim 6, wherein the first CAM memory core cell has a first data output and a second data output, the first P-channel transistor is gated by a match control line, and wherein the comparison logic comprises:
    a first N-channel transistor configured to connect the positive comparison bit line with the match control line, the first N-channel transistor being gated by the second data output; and
    a second N-channel transistor configured to connect the negative comparison bit line with the match control line, the second N-channel transistor being gated by the first data output.

8. The CAM cell of claim 7, wherein the first CAM memory core cell has a first control input, a first data line and a second data line, the second CAM memory core cell has a second control input, a third data line, a fourth data line, a third data output, and a fourth data output, and wherein the second P-channel transistor is gated by the fourth data output.

9. The CAM cell of claim 8, wherein the first CAM memory core cell comprises:
    a first memory element configured to store a data bit;
    a third N-channel transistor coupled with the first memory element, the third N-channel transistor being gated by the first control input; and
    a fourth N-channel transistor coupled with the first memory element, the fourth N-channel transistor being gated by the first control input.

10. The CAM cell of claim 9, wherein the second CAM memory core cell comprises:
a second memory element configured to store a mask bit;
a fifth N-channel transistor coupled with the second memory element, the fifth N-channel transistor being gated by the second control input; and
a sixth N-channel transistor coupled with the second memory element, the sixth N-channel transistor being gated by the second control input.

11. The CAM cell of claim 10, wherein the first data output is a positive storage bit, the second data output is a negative storage bit, the first control input is a word line input, the second control input is the word line input, the third data output is a positive mask bit, and the fourth data output is a negative mask bit.

12. The CAM cell of claim 10, wherein the first memory element comprises a static memory device, and wherein the second memory element comprises a static memory device.

13. The CAM cell of claim 10, wherein the first memory element comprises a dynamic memory device, and wherein the second memory element comprises a dynamic memory device.

14. The CAM cell of claim 10, wherein the first memory element comprises a non-volatile memory device, and wherein the second memory element comprises a non-volatile memory device.

15. The CAM cell of claim 1, wherein utilization of the Miller effect is limited to utilization of an effective capacitance at the junction of a transistor in the comparison circuitry.

16. A method of operating a content addressable memory (CAM) having CAM cells that employ P-channel transistors to communicate comparison results to match lines, the method comprising the steps of:
discharging a match line input to VSS, the discharging occurring in part via grounding circuitry included within CAM cells connected by a match line, thereby causing intermediate nodes on the match line to discharge to a voltage level just above VSS during normal operation, the intermediate nodes lying between CAM cells having P-channel transistors connected in series on the match line;
transitioning comparison inputs to the CAM cells, the transitioning step being for initiation of a comparison operation, and the transitioning occurring at substantially the same time for each of the comparison inputs;
charging the match line input to VDD during the comparison operation; and
utilizing a Miller effect to stop a signal flow from passing through one of the CAM cells when that one of the CAM cells identifies a mismatch for the comparison operation.

17. The method of claim 16, further comprising the step of utilizing the voltage level just above VSS on the intermediate nodes to improve propagation time for a signal flow passing through one of the CAM cells when that one of the CAM cells identifies a match for the comparison operation.

18. The method of claim 17, wherein VDD is 1.8 volts, VSS is 0.0 volts, and a voltage level for the intermediate nodes before the compare operation is approximately 0.7 volts.

19. The method of claim 17, wherein the discharging step further comprises discharging a match line output node to VSS, and wherein normal operation is after two compare operations have been performed.

20. The method of claim 17, wherein the charging step is performed using a pre-charge line, and two transistors.

21. The method of claim 17, wherein the CAM cells also have second P-channel transistors coupled in parallel with the P-channel transistors connected in series on the match line.

22. The method of claim 21, wherein the CAM cells further comprise first CAM memory core cells for storing data, second CAM memory core cells for storing masking data, the second CAM memory core cells being coupled with the second P-channel transistors, and the CAM cells further comprising comparison circuitry coupled with the P-channel transistors and the first CAM memory core cells.

23. The method of claim 22, wherein the first CAM memory core cells are dual-ended.

24. The method of claim 22, wherein the second CAM memory core cells are dual-ended.

25. The method of claim 16, wherein the utilizing step comprises raising a voltage level on a match control line enough to effectively shut off a P-channel transistor.

26. A method of designing a content addressable memory (CAM) comprising the steps of:
connecting CAM cells that employ P-channel transistors to communicate comparison results to match lines and employ grounding circuitry such that, during normal operation, intermediate nodes between CAM cells in a match line chain do not drop all the way to VSS before a compare operation;
coupling a match line input with a pre-charge line and with a match line for the CAM cells in the match line chain such that the match line input is electrically switched from a connection with VSS to a connection with VDD during the compare operation; and
designing driver circuits that allow transitioning of comparison inputs to the CAM cells in the match line chain to be performed nearly simultaneously, the driver circuits being coupled with the pre-charge line such that a Miller effect may be used during the compare operation to stop a signal flow from passing through one of the CAM cells in the match line chain when that one of the CAM cells identifies a mismatch.

27. The method of claim 26, wherein VDD is 1.8 volts, VSS is 0.0 volts, and a voltage level for the intermediate nodes before the compare operation is approximately 0.7 volts.

28. The method of claim 26, further comprising the step of coupling a match line output node with the match line and with a line connecting grounding circuitry within the CAM cells.

29. The method of claim 26, wherein normal operation is after two compare operations have been performed.

30. The method of claim 26, wherein the connection with VSS is an N-channel transistor coupled with the pre-charge line, and wherein the connection with VDD is a P-channel transistor coupled with the pre-charge line.

31. The method of claim 26, wherein the designing step further comprises designing the driver circuits to minimize power consumption by the CAM in a worst case scenario.

32. The method of claim 26, wherein the CAM cells also employ second P-channel transistors to communicate masking results to the match lines.

33. The method of claim 32, wherein the CAM cells further comprise first CAM memory core cells configured to store data, second CAM memory core cells configured to store masking data, the second CAM memory core cells being coupled with the second P-channel transistors, and the CAM cells further comprising comparison circuitry coupled with the P-channel transistors and the first CAM memory core cells.

34. The method of claim 33, wherein the first CAM memory core cells are dual-ended.

35. The method of claim 33, wherein the second CAM memory core cells are dual-ended.

36. The method of claim 26, further comprising the steps of:
  coupling the CAM cells in the match line chain with a second set of CAM cells in a second match line chain of equal length, thereby forming a partial word of memory with a single match output;
  connecting multiple match outputs from multiple partial words of memory with hierarchical logic, thereby forming a word of content addressable memory with a single match output; and
  coupling multiple words of content addressable memory with an output block.

37. The method of claim 36, wherein the output block is a random access memory.

38. The method of claim 36, wherein the output block is an encoder.

39. The method of claim 38, wherein the encoder is a priority encoder.

40. The method of claim 26, wherein utilization of the Miller effect comprises using the Miller effect to raise a voltage level on a match control line enough to effectively shut off a P-channel transistor.

41. A content addressable memory (CAM) cell comprising:
  means for storing a data bit;
  means for comparing a comparison input with the stored bit, the means for comparing being coupled with the means for storing a data bit;
  first P-channel transistor means for connecting a match line input with a match line output, the first P-channel transistor means being coupled with the means for comparing;
  means for storing a mask bit;
  second P-channel transistor means for connecting the match line input with the match line output, the second P-channel transistor means being coupled with the means for storing a mask bit; and
  means for grounding an output line, the means for grounding being coupled with the means for storing a mask bit and with the means for comparing a comparison input with the stored bit.

42. A content addressable memory (CAM) comprising a plurality of cells, each cell comprising:
  a comparison bit line;
  a first CAM memory core cell configured to store data;
  comparison circuitry coupled with the comparison bit line and the first CAM memory core cell;
  a first P-channel transistor configured to communicate a comparison result to a match line using the Miller effect, the first P-channel transistor being coupled with the comparison circuitry; and
  grounding circuitry coupled with a ground and the comparison circuitry.

43. The CAM of claim 42, further comprising:
  a second CAM memory core cell configured to store masking data, the second CAM memory core cell being coupled with the grounding circuitry; and
  a second P-channel transistor configured to communicate a masked state to the match line, the second P-channel transistor being coupled with the second CAM memory core cell.

44. The CAM of claim 43, wherein the comparison bit line is a positive comparison bit line, the first CAM memory core cell is dual-ended, each cell further comprising a negative comparison bit line coupled with the comparison circuitry.

45. The CAM of claim 44, wherein the second CAM memory core cell is dual-ended.

46. The CAM of claim 42, wherein utilization of the Miller effect comprises using the Miller effect to raise a voltage level on a match control line enough to effectively shut off the first P-channel transistor.

* * * * *